(12) United States Patent
Hsieh et al.

(10) Patent No.: US 6,511,907 B1
(45) Date of Patent: Jan. 28, 2003

(54) METHOD FOR FORMING A LOW LOSS DIELECTRIC LAYER IN THE TUNGSTEN CHEMICAL MECHANIC GRINDING PROCESS

(75) Inventors: Jung-Yu Hsieh, Hsinchu (TW); Uway Tseng, Houli Shiang (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/983,565

(22) Filed: Oct. 25, 2001

(51) Int. Cl.⁷ .......................................... H01L 21/4763
(52) U.S. Cl. ........................................ 438/633; 438/634
(58) Field of Search ................................ 438/631, 633, 438/634, 636, 637, 643

(56) References Cited

U.S. PATENT DOCUMENTS

| | | | | |
|---|---|---|---|---|
| 5,302,551 A | * | 4/1994 | Iranmanesh | 438/633 |
| 5,891,513 A | * | 4/1999 | Dubin et al. | 438/633 |
| 5,970,374 A | * | 10/1999 | Teo | 439/629 |
| 6,140,224 A | * | 10/2000 | Lin | 438/634 |
| 6,228,760 B1 | * | 8/2001 | Yu et al. | 438/636 |
| 6,294,459 B1 | * | 9/2001 | Yin et al | 438/636 |
| 6,372,630 B1 | * | 4/2002 | Uchiyama et al. | 438/624 |
| 2001/0016414 A1 | * | 8/2001 | Yu et al. | 438/636 |

* cited by examiner

Primary Examiner—Olik Chaudhuri
Assistant Examiner—David S Blum
(74) Attorney, Agent, or Firm—Rosenberg, Klein & Lee

(57) ABSTRACT

A method for forming a low loss dielectric layer in the tungsten chemical mechanic grinding process is disclosed. After forming a dielectric layer on the semiconductor substrate and smoothing the dielectric layer as an inner dielectric layer, a stop layer of undoped silicon dioxide, organ spin on glass, or silicon oxygen nitride are coated thereon. After process of plug lithographic and etching, a barrier layer of tungsten plug and metal tungsten are deposited sequentially. Finally, the surplus tungsten metal layer on the surface of a dielectric layer is removed by chemical mechanic grinding process until the stop layer is exposed. In the present invention, the stop layer is used to repair the scratches or defects generated from the smoothness in the chemical mechanic grinding process. Furthermore, in the tungsten chemical mechanic grinding process, it can assure that the inner dielectric layer will not be ground so that the object of low loss is achieved.

14 Claims, 3 Drawing Sheets

METHOD FOR FORMING A LOW LOSS DIELECTRIC LAYER IN THE TUNGSTEN CHEMICAL MECHANIC GRINDING PROCESS

FIELD OF THE INVENTION

The present invention relates to a manufacturing process in semiconductor integrated circuit, and especially to a method for forming a low loss inner dielectric layer and inter-metal dielectric layer in the tungsten chemical mechanic grinding process.

BACKGROUND OF THE INVENTION

With the advance in logic operation ability of integrated circuits and memory capacities, the line widths of the semiconductor elements are made smaller and smaller so that the number of layers of metal interconnecting wires must be increased continuously. The flatness between different layers becomes an important factor. With the increment of metal layers, the step heights are also increased. If the flatness process is not properly processed, the succeeding process, such lithography, etching, and other process can not be made well. The chemical mechanic grinding process is the most effective step for flatness.

Currently, chemical mechanic grinding process is widely used in the processes of shallow trench isolation, inner dielectric layer, inter-metal dielectric layer, metal lead layer, and metal plug. In the process of metal plug, the tungsten plug is the most important one. Since the melting point of tungsten is high and it has a thermal expansion coefficient correspondent to that of silicon, while the inner stress of tungsten deposited by lower pressure chemical vapor deposition (LPCVD) is not enough, further it has a preferred step covering ability. Therefore, to deposit tungsten by LPCVS to be formed with a metal plug becomes a standard manufacturing process in VLSI. Therefore, the tungsten chemical mechanic grinding process is an important process.

Tungsten chemical mechanic grinding process comprises the following steps: first, lithograph and etch an dielectric layer; secondary, sputtering titanium/titanium oxide; third, deposit tungsten metal layer by chemical gas deposition; and fourth, perform the flatness process of tungsten chemical mechanic grinding process. In above process, after depositing the dielectric layer and performing flatness by LPCVD, it is possible scratches and defects are left on the surface of the dielectric layer. To assure the tungsten metal out of the plug can be ground completely to avoid the short circuit in the succeeding metal lead, in general, over-grinding occurs, thereby reducing the thickness of the dielectric layer. Meanwhile, the dielectric layer is possible scratched due to the chemical mechanic grinding process so that in the succeeding process of forming metal leads, the metal is deposited in the scratches or the defects. This is difficult to be removed by etching so that short circuit occurs between tungsten plugs.

In abovesaid tungsten chemical mechanic grinding process, it is possible to induce the reduction of the thickness of dielectric layer or generating scratches or defects on the surface of the dielectric layer so that short circuit occurs in the succeeding process of forming metal leads. This will be described in detail by those disclosed in FIGS. 1A to 1C, which illustrated an embodiment of the inner dielectric layer. For brevity, the MOS transistor structure in the silicon substrate 10 under the inner dielectric layer is neglected. At first, as illustrated in FIG. 1A, an inner dielectric layer 12 is coated on the surface of the silicon substrate 10 and is smoothed. Next, in FIG. 1B, the inner dielectric layer 12 is lithographed for defining a plug and then is etched. Then, the deposition of the barrier layer 14 and tungsten metal layer 16 is executed. Finally, the surplus tungsten metal layer 16 and barrier layer 14 on the inner dielectric layer are ground by chemical mechanic grinding process until the inner dielectric layer 12 is exposed as illustrated in FIG. 1C so as to be formed with a plug.

Since the inner dielectric layer 12 is finally contacted directly with the grinding pad which is also used as a stop layer. To assure the above tungsten chemical mechanic grinding process can be ground completely, over-grinding is executed so that the thickness of the inner dielectric layer 12 is reduced. Since the inner dielectric layer 12 is directly in contact with the grinding pad so that scratches and defects occurs. Therefore, in the succeeding metal layer process, the tungsten plug will short circuit.

SUMMARY OF THE INVENTION

Accordingly, the object of the present invention is to provide a method for forming a low loss dielectric layer in the tungsten chemical mechanic grinding process, wherein a stop layer is used to repair the scratches or defects generated from the smoothness in the chemical mechanic grinding process. Furthermore, in the tungsten chemical mechanic grinding process, it can assure that the inner dielectric layer will not be ground so that the object of low loss is achieved.

Another object of the present invention is to provide a method for forming a low loss dielectric layer in the tungsten chemical mechanic grinding process, wherein the micro scratch generated on the surface of the dielectric layer after CMP grinding is filled completely so as to avoid the short circuit of the tungsten plug due to the scratches or defects on the dielectric layer.

Another object of the present invention is to provide a method for forming a low loss dielectric layer in the tungsten chemical mechanic grinding process, wherein after forming a dielectric layer on the semiconductor substrate and smoothing the dielectric layer as an inner dielectric layer, a stop layer of undoped silicon dioxide, organic spin on glass, or silicon oxygen nitride are coated thereon. After process of plug lithographic and etching, a barrier layer of tungsten plug and metal tungsten are deposited sequentially. Finally, the surplus tungsten metal layer on the surface of a dielectric layer is removed by chemical mechanic grinding process until the stop layer is exposed.

The various objects and advantages of the present invention will be more readily understood from the following detailed description when read in conjunction with the appended drawing.

DETAILED DESCRIPTION OF THE PREFERRED EMBODIMENTS

Referring to FIGS. 2A to 2D, cross sectional views of the embodiment about the process of making an inner dielectric layer 44 in the present invention is illustrated. The critical steps in the manufacturing process is illustrated in these drawings.

Figure 1A:
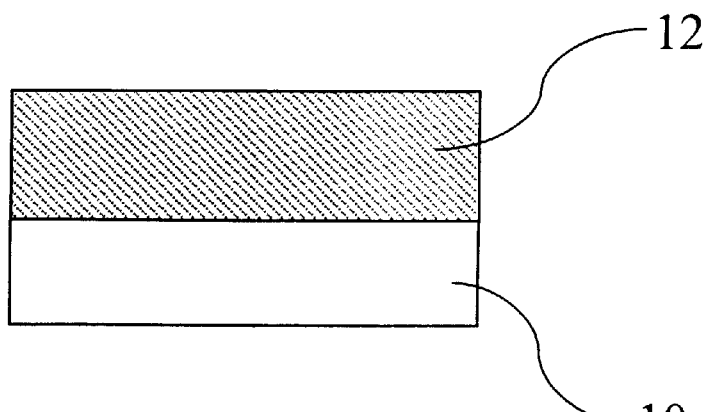
FIGS. 1A to 1C shows the manufacturing process of manufacturing tungsten plug in the prior art.
Figure 1B:
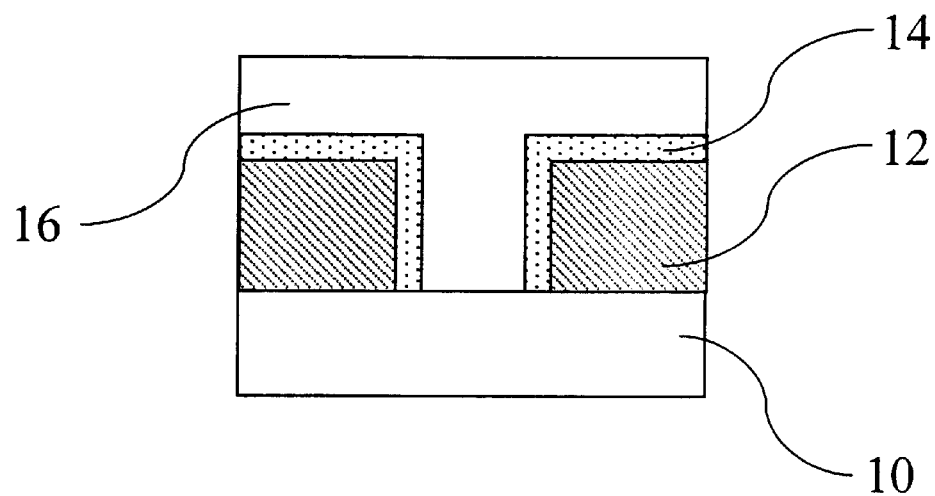
Figure 1C:
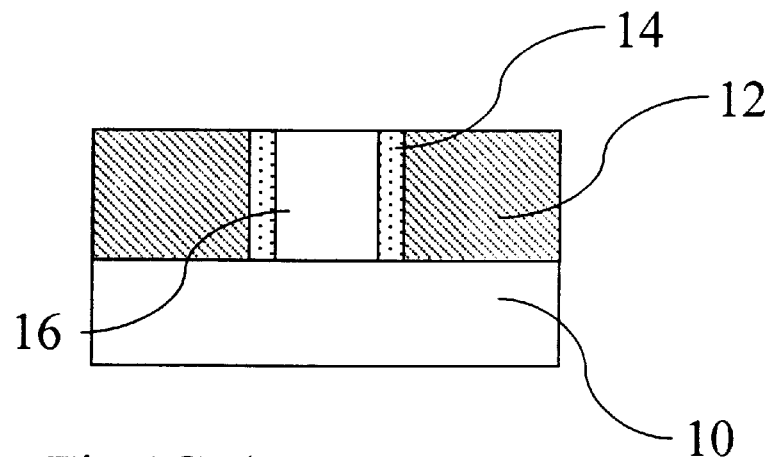
Figure 2A:
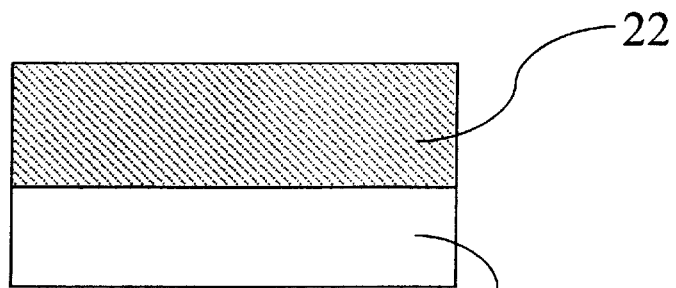
FIGS. 2A to 2D is a schematic view showing the process of forming an inner dielectric layer in the manufacturing tungsten plug of the present invention.

With reference to FIG. 2A, a semiconductor substrate 20 is provided. The basic elements with completely front stage process are formed thereon. To simplifying the whole structure, the MOS transistors and other basic elements in the semiconductor substrate 20 will be neglected. The surface of the semiconductor substrate 20 is deposited with a dielectric layer made by borophosphosilicate glass (BPSG) for using as an inner dielectric layer 22 with a thickness of about 5000 Å to 10000 Å. Then, by chemical mechanic grinding process or thermal flowing process, a flatness process is applied to the inner dielectric layer 22 for achieving the object of whole flateness.

Figure 2B:
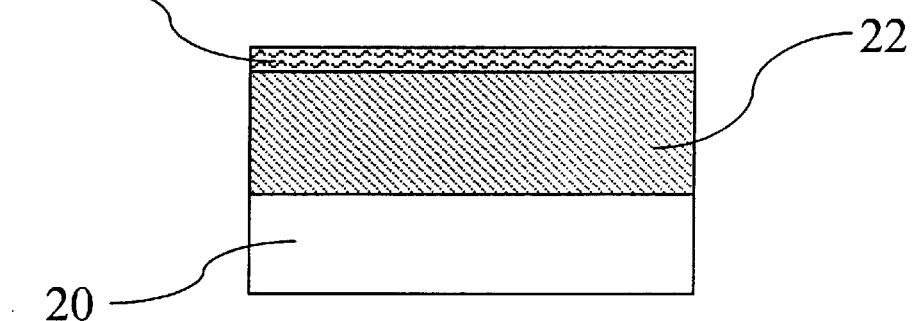

Referring to FIG. 2B, the inner dielectric layer 22 processed by CMP is coated with a layer of uniform stop layer 24. The stop layer 24 is undoped silicon dioxide which is made by depositing a layer with a thickness about 1000 Å to 3000 Å by PECVD (plasma enhance chemical vapor deposition) or LPCVD (low pressure chemical vapor deposition). Furthermore, an organic spin on glass (SOG) can be used as the stop layer with a thickness about 1000 Å to 2000 Å, or by depositing SiON with a thickness of about 500 Å to 1500 Å by PECVD or LPCVD.

Figure 2C:
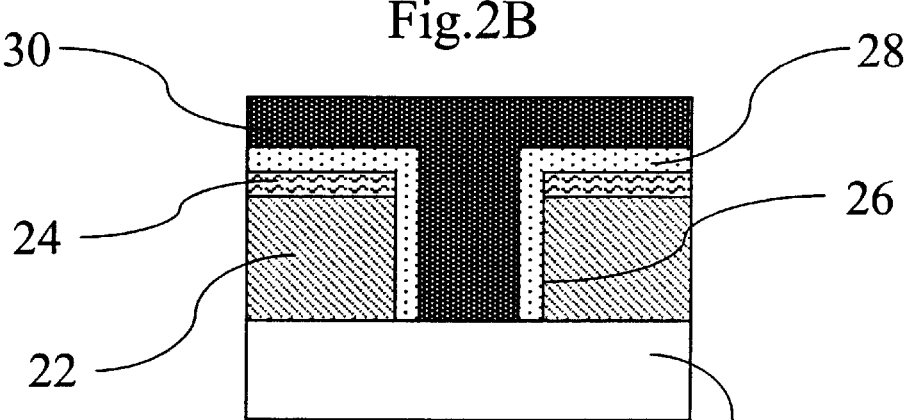
Figure 2D:
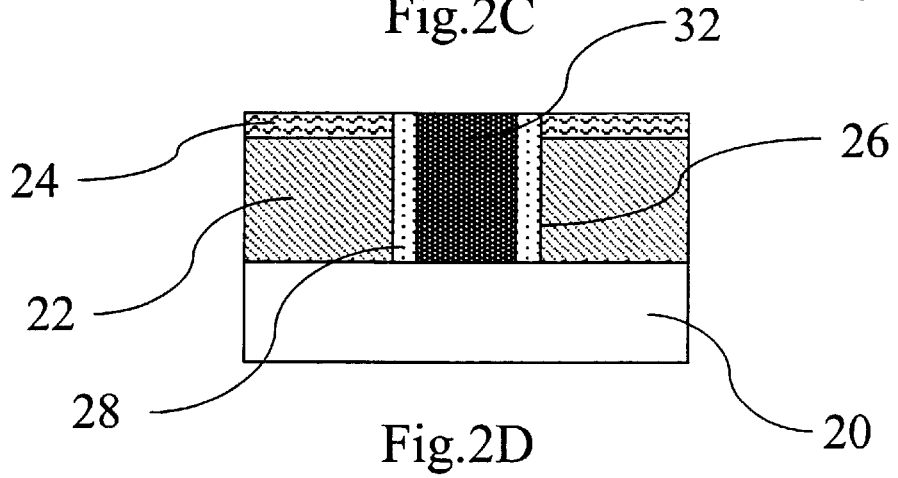

Next, the lithographic etching process of plug is performed so as to be formed with via hole 26 of the inner dielectric layer 22, as illustrated in FIG. 2C. A layer of titanium nitride barrier layer 28 is deposited on the surface of the inner dielectric layer 22 and the inner wall of the via hole 26. Then, tungsten metal layer 30 is deposited so that the tungsten metal layer 30 will fully fill the via hole 26. Finally, a process of tungsten chemical mechanic grinding process is performed. The surplus tungsten metal layer 30 and barrier layer 28 above the inner dielectric layer 22 is removed by chemical mechanic grinding process. It is over-ground to expose the stop layer 24. After ground, the tungsten metal layer residue in the via hole 26 is formed with tungsten plugs 32 as illustrated in FIG. 2D.

For the borophosphosilicate glass (BPSG) as an inner dielectric layer 22, if undoped silicon dioxide is used as the material of the stop layer 24, it has a BPSG/undoped silicon dioxide ratio of about 2. Further, if organ-SOG as material of the stop layer 24, the BPSG/organic SOG ratio is about 3. Finally, if SiON is used as material of stop layer 24, it has a BPSG/SiON ratio of about 3. Therefore, it is appreciated, the stop layer 24 from above material is used as the stop layer in the tungsten chemical mechanic grinding process, a low loss dielectric layer better than the prior art is acquired, and the defects are reduced.

Another embodiment of the present invention is illustrated in FIGS. 3A to 3D, the cross sectional views of a preferred embodiment for manufacturing an inter-metal dielectric layer is illustrated. In the drawing, only critical steps in the manufacturing process are illustrated.

Figure 3A:
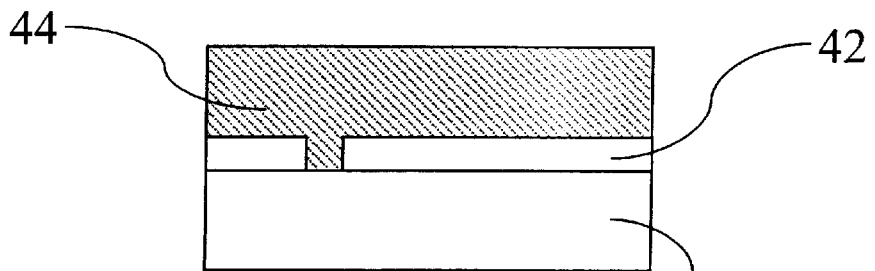
FIGS. 3A to 3D is a schematic view showing the process of forming an inter-metal dielectric layer in manufacturing tungsten plug of the present invention.

According to FIG. 3A, a semiconductor substrate 40 with a finished front stage is shown. A plurality of metal interconnecting wires 42 are formed on the surface of the semiconductor substrate 40. The metal interconnecting wires 42 are made from one of the aluminum, aluminum copper alloy, aluminum silicon copper alloy or copper.

Figure 3B:
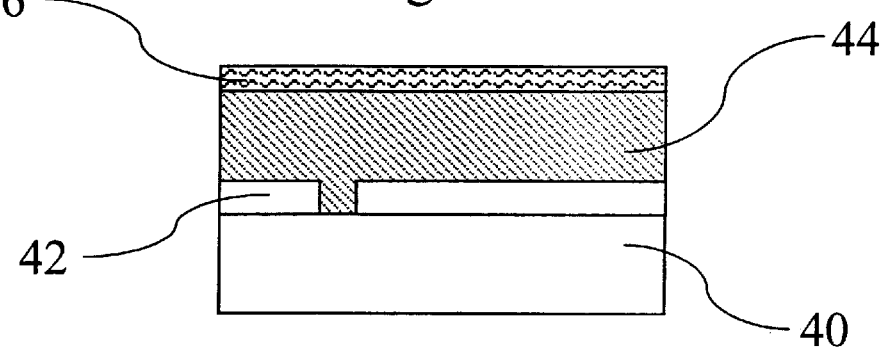
Figure 3C:
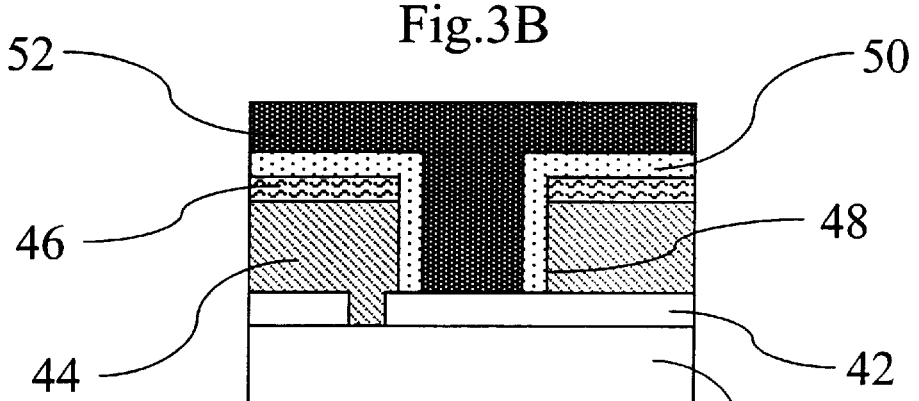

With reference to FIG. 3B, a dielectric layer is formed on the surfaces of the metal interconnecting wires 42 and the semiconductor substrate 40 to be as an inter-metal dielectric layer 44. Then, the inter-metal dielectric layer 44 is ground by chemical mechanic grinding process so as to flat the structure. In general, the inter-metal dielectric layer 44 is made of phosphosilicate glass (PSG), Fluorosilicate glass (FSG), or silicon oxide by PECVD, or tetrathyl-orthosilicate (TEOS) by PECVD.

Figure 3D:
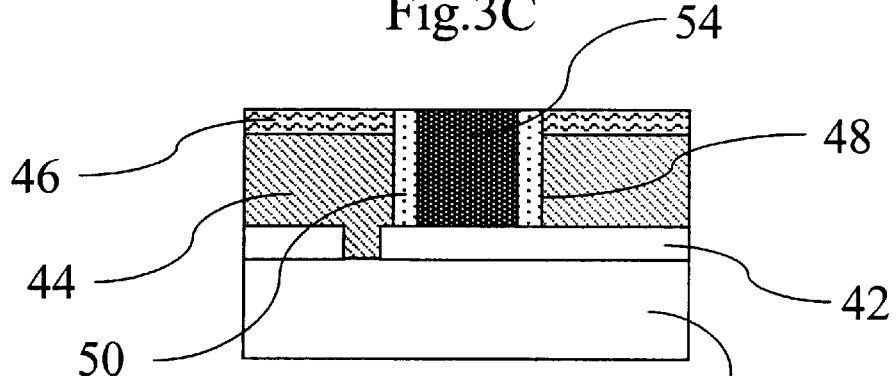

A uniform stop layer 46 covers on the inter-metal dielectric layer 44. Next, the lithographic etching process for forming a plug is executed so that via hole 48 is formed on the dielectric layer 44 and the metal interconnecting wires 42 are exposed out as FIG. 3C. A barrier layer 50 is deposited on the surface of the inter-metal dielectric layer 44 and the inner wall of the via hole 48. Then a tungsten metal layer 52 is deposited so that the tungsten metal layer 52 fully fills the via hole 48. Finally, the surplus tungsten metal layer 52 and barrier layer 50 on the inter-metal dielectric layer 44 are removed by chemical mechanic grinding process until the stop layer 46 exposed out. After ground, a tungsten plug as illustrated in FIG. 3D is formed. Since the manufacturing method of the rear section of this inter-metal dielectric layer 44 is identical to the embodiment of the inner dielectric layer 22. Therefore, the detail will not be described further.

In the present invention, by the action of the stop layer on the dielectric layer, the loss of dielectric layer is prevented effectively in the tungsten chemical mechanic grinding process. Moreover, the micro scratch generated on the surface of the dielectric layer after CMP grinding is filled completely so as to avoid the short circuit of the tungsten plug due to the scratches or defects on the dielectric layer. Besides, in the present invention, if silicon oxide is used as material of the stop layer of the dielectric layer, due to the property of light reflection, it is an anti-reflection layer in the process of tungsten plug lithography and etching process, thereby avoiding the effect of reflecting light to the plug lithography process and the accuracy in the control of the line width in the lithographt process is increased.

The present invention are thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for forming a low loss dielectric layer in the tungsten chemical mechanic grinding process, comprising the steps of:

providing a semiconductor substrate having basic elements thereon;

forming a dielectric layer on the semiconductor substrate and smoothing the dielectric layer as an inner dielectric layer;

coating a uniform stop layer on the inner dielectric layer, wherein the stop layer is an organic spin on glass;

performing lithography and etching process of a plug for forming a via hole on the dielectric layer;

depositing a barrier layer and a tungsten metal layer, wherein the tungsten metal layer filling completely the via hole; and removing the surplus tungsten metal on the dielectric layer by chemical mechanic grinding process and over-grinding to expose the stop layer.

2. The method as claimed in claim 1, wherein a material of the dielectric layer is borophosphosilicate glass.

3. The method as claimed in claim 1, wherein the smooth of the dielectric layer is executed by chemical mechanic grinding process.

4. The method as claimed in claim 1, wherein a material of the stop layer is selected from an undoped oxide with a thickness between 1000 Å and 3000 Å.

5. The method as claimed in claim 1, wherein the spin on glass includes an updoped oxide with a thickness between 1000 Å and 2000 Å.

6. The method as claimed in claim 1, wherein a material of the stop layer is silicon oxygen nitride with a thickness between 500 Å and 1500 Å.

7. The method as claimed in claim 6, wherein the silicon oxygen nitride of the stop layer is used as an anti-reflection layer in tungsten lithography process.

8. A method for forming a low loss dielectric layer in the tungsten chemical mechanic grinding process, comprising the steps of:

provinding a semiconductor substrate having basic elements thereon; a plurality of metal interconnecting wires being formed on the semiconductor substrate;

forming a dielectric layer on the semiconductor substrate and smoothing the dielectric layer as an inner dielectric layer;

coating a uniform stop layer on the inner dielectric layer, wherein the stop layer is an organic spin on glass;

performing lithographic etching of a plug for forming a via hole on the dielectric layer;

depositing a barrier layer and a tungsten metal layer, wherein the tungsten metal layer filling completely the via hole; and removing the surplus tungsten metal on the dielectric layer by chemical mechanic grinding process and overgrinding to expose the stop layer.

9. The method as claimed in claim 8, wherein the inter-metal dielectric layer is selected from a group containing, silicon oxide, tetrathyl-orthosilicate, boron phosphosilicate glass and phosphosilicate glass.

10. The method as claimed in claim 8, wherein the smooth of the dielectric layer is executed by chemical mechanic grinding process.

11. The method as claimed in claim 8, wherein a material of the stop layer is selected from an undoped oxide with a thickness between 1000 Å and 3000 Å.

12. The method as claimed in claim 8, the spin on glass includes an updoped oxide with a thickness between 1000 Å and 2000 Å.

13. The method as claimed in claim 8, wherein a material of the stop layer is silicon oxygen nitride with a thickness between 500 Å and 1500 Å.

14. The method as claimed in claim 13, wherein the silicon oxygen nitride of the stop layer is used as an anti-reflection layer in tungsten lithography process.

* * * * *